(12) United States Patent
Taylor et al.

(10) Patent No.: US 6,861,845 B2
(45) Date of Patent: Mar. 1, 2005

(54) FAULT LOCATOR

(75) Inventors: Ralph Taylor, Lee's Summit, MO (US); Harold King, Kansas City, MO (US); Michael Bequette, Lansing, KS (US)

(73) Assignee: DIT-MCO International Corporation, Kansas City, MO (US)

( * ) Notice: Subject to any disclaimer, the term of this patent is extended or adjusted under 35 U.S.C. 154(b) by 29 days.

(21) Appl. No.: 10/308,660

(22) Filed: Dec. 2, 2002

(65) Prior Publication Data

US 2004/0104730 A1 Jun. 3, 2004

(51) Int. Cl.[7] .......................... G01R 31/08; G06F 19/00
(52) U.S. Cl. ...................... 324/512; 324/519; 324/525; 702/58
(58) Field of Search ................................ 324/519, 525, 324/527, 523, 522, 528, 540, 73.1, 537; 702/58, 108, 118, 119

(56) References Cited

U.S. PATENT DOCUMENTS

| | | | | |
|---|---|---|---|---|
| 4,565,966 A | * | 1/1986 | Burr et al. ................... | 324/519 |
| 5,006,808 A | * | 4/1991 | Watts .......................... | 324/537 |
| 5,621,327 A | * | 4/1997 | Chiang et al. ............... | 324/537 |
| 5,744,964 A | * | 4/1998 | Sudo et al. .................. | 324/537 |
| 6,456,089 B1 | * | 9/2002 | Vuksic ........................ | 324/537 |

* cited by examiner

Primary Examiner—Anjan K. Deb
(74) Attorney, Agent, or Firm—Hovey Williams LLP

(57) ABSTRACT

A self-compensating fault locator (10) broadly comprises a testing unit (16) to take measurements across two test points (18), a processing unit (20) to locate faults by analyzing the measurements, and a switching unit (22) that can connect termination points (14) of an electrical circuit (12) to the test points (18) in a sequence controlled by the processing unit (20). The fault locator (10) may also include a harness (24) to connect the electrical circuit (12) to the switching unit (22). The processing unit (20) is preferably programed with the electrical circuit's (12) interconnection information. The processing unit (20) also preferably stores internal characteristics of the fault locator (10). Using the interconnection information and the internal characteristics, the processing unit (20) may accurately locate faults within the electrical circuit (12). Additionally, the processing unit (20) may locate faults within the fault locator (10) and/or the harness (24).

25 Claims, 6 Drawing Sheets

FAULT LOCATOR

BACKGROUND OF THE INVENTION

1. Field of the Invention

The present invention relates to fault locators. More particularly, the present invention provides an electrical fault locator that can automatically and accurately locate both short-circuit and open-circuit faults.

2. Description of Prior Art

As aircraft, other vehicles, backplanes, appliances, black-boxes, and other equipment become more and more complex, electrical circuits used to power and control such equipment also becomes more and more complex. Testing for and locating faults within complex electrical circuits can be quite demanding and labor intensive, since electrical circuits may include hundreds of termination points that need to be tested.

In an effort to help technicians find faults within electrical circuits, many testing mechanisms have been developed. Most mechanisms simply identify which specific termination points of electrical circuits are in conflict. While such mechanisms typically reduce the labor requirements involved in testing complex electrical circuits, they typically only identify conflicts and do not generally specifically identify locations of faults.

For example, a mechanism may note that a first termination point is connected to a second termination point in a specific electrical circuit. A technician may have to determine if the first termination point is supposed to be connected to the second termination point in order to know if a fault truly exists. Additionally, in a long and complex electrical circuit, the technician may have to examine many wires, terminal blocks, and other electrical elements in order to actually locate the fault.

Some advanced testing mechanisms may be able to inform technicians what faults exist by comparing measurements taken from electrical circuits with interconnection information containing details of the electrical circuits. However, these advanced mechanisms can typically only generally identify or find faults, still requiring technicians to spend many hours actually locating the faults.

Accordingly, there is a need for an improved fault locator that overcomes the limitations of the prior art.

SUMMARY OF THE INVENTION

The present invention overcomes the above-identified problems and provides a distinct advance in the art of fault locators. More particularly, the present invention provides an electrical fault locator that can automatically and accurately locate both short-circuit and open-circuit faults within an electrical circuit having a plurality of termination points. The fault locator broadly comprises a testing unit to take a resistance measurement between and a capacitance measurement across two test points, a processing unit to locate faults by analyzing the measurements taken by the testing unit, and a switching unit that can connect the termination points to the test points in a sequence controlled by the processing unit. The fault locator may also include a wiring harness, fixture, or other adapter to connect the electrical circuit to the switching unit. Alternatively, the switching unit may be designed to mate directly with the electrical circuit.

The electrical circuit may include several hundred termination points, with each termination point preferably wired to at least one other termination point according to design requirements and application of the electrical circuit. For example, the electrical circuit may include termination points, such as A1, A2, B1, B2, C1, C2, and X1. Additionally, the electrical circuit may include a plurality of terminal blocks, such as TB1, TB2, and TB3. The electrical circuit may also include other common electrical elements, such as, resistors, capacitors, inductors, lamps, switches, diodes, and fuses. Furthermore, the electrical circuit may comprise any combination of circuit board traces and/or bundles of various wiring types, such as coaxial wire, twisted pair, shielded wire, and individual conductors.

The electrical circuit may be of the type used in aircraft, other vehicles, backplanes, appliances, black-boxes, and/or other complicated equipment. For example, the electrical circuit may be designed to provide interconnections for a Boeing model 767 commercial jet airliner. Alternatively, the electrical circuit may be designed to provide interconnections for a light-rail train, an automobile, printed circuit board or a super computer. In any case, the electrical circuit may include many wire runs or interconnections each of differing length, wire size, and/or type. Additionally, the termination points may terminate in individual connectors, be grouped into collective connectors, or use a combination of connectors.

As will be discussed in greater detail below, the fault locator is programmed with interconnection information which is unique to the electrical circuit. However, it is anticipated that the fault locator will be used to test many different electrical circuits. For example, a specific aircraft typically includes more than one unique electrical circuit. While the fault locator must be reprogrammed for each unique electrical circuit, the fault locator may be used to test each unique electrical circuit in the specific aircraft or may be used to test unique electrical circuits from several aircraft.

The testing unit preferably comprises a first and second test point, such as T1 and T2, a precision current source connected across the test points, and a precision voltage sensor also connected across the test points. The testing unit preferably takes the resistance measurement using the current source to apply current through the test points and the voltage sensor to sense voltage across the test points, which is directly proportional to the resistance measurement. Dividing the voltage across the test points by the current through the test points yields the resistance measurement, according to Ohm's Law.

Similarly, the testing unit preferably takes the capacitance measurement using the current source to apply current through the test points and the voltage sensor to sense voltage across the test points. However, in taking the capacitance measurement, the testing unit preferably times how long it takes to reach a specified voltage across the test points, which is directly proportional to the capacitance measurement. In other words, the longer it takes to reach the specified voltage, the higher the capacitance measurement.

The testing unit and the switching unit preferably operate together and under control of the processing unit. As discussed above, the testing unit preferably includes two test points, and yet is preferably able to take the resistance measurement between each pair of termination points and the capacitance measurement across each termination point and a reference point, which is preferably an unused termination point, such as X1. Thus, the switching unit facilitates connecting the test points to each of the termination points.

The switching unit preferably comprises a pair of single pole single throw relays, such as R1, R2, R3, R4, R5, and R6, connected to each termination point. A first relay is preferably connected to T1 and a second relay is preferably connected to T2. The relays are preferably controlled by an addressing unit that individually energizes the relays according to digital address words received from the processing unit over an address bus. The address words direct which termination point should be connected to which test point, and thus instruct the addressing unit which relays should be energized.

As discussed above, the processing unit is preferably programed with the electrical circuit's interconnection information, thereby allowing the processing unit to know which combinations of termination points should result in high and low resistance measurements. Thus, the processing unit preferably compares each resistance measurement to the interconnection information to identify which termination points are in conflict and in what manner the termination points conflict, thereby determining what faults exist in the electrical circuit. However, it is insufficient for the processing unit to simply determine which termination points are in conflict, since this doesn't effectively inform a service technician where he or she should begin in order to actually locate and fix the faults. Without more information, the technician must spend many hours trying to locate and fix the faults.

In order to help the technician locate and fix the faults, the processing unit is preferably able to use the measurements to determine where each fault is located in the electrical circuit. For example, if TB1 is shorted to X1, then the testing unit would measure relatively low resistance between any combination of A1, B1, and X1. While the processing unit may expect the resistance measurement to be relatively low between A1 and B1, the resistance measurement between A1 and X1 is expected to be relatively high. Additionally, the resistance measurement between B1 and X1 is also expected to be relatively high. Since the resistance measurements involving X1 are relatively low, then the processing unit determines that there must be a short-circuit fault (SCF) to X1 somewhere between A1 and B1.

The processing unit next identifies where, between A1 and B1, the SCF is located by comparing the corresponding resistance measurements. As an example, suppose the resistance measurement between A1 and B1 is found to be approximately 0.2461 Ohms, the resistance measurement between A1 and X1 is found to be approximately 0.2166 Ohms, and the resistance measurement between B1 and X1 is found to be approximately 0.1085 Ohms. Since the resistance measurement between B1 and X1 is the smallest value, the SCF must be closer to B1 than to A1.

The processing unit can be even more precise by adding the resistance measurement between A1 and X1 to the resistance measurement between B1 and X1 which yields a sum of approximately 0.3251. The sum, in this case, inherently includes the resistance between X1 and the SCF measured twice and the resistance measurement between A1 and B1. It can be seen that, the sum is approximately 0.0790 Ohms greater than the resistance measurement between A1 and B1. Therefore, the resistance between X1 and the SCF is approximately 0.0395 Ohms.

In order to locate the SCF with respect to A1 and B1, the 0.0395 resistance can be subtracted from the resistance measurement between A1 and X1 and the resistance measurement between B1 and X1. In this case, the resistance between A1 and the SCF is approximately 0.1771 Ohms and the resistance between B1 and the SCF is approximately 0.0690 Ohms. The processing unit then calculates a resistance ratio (RR) of approximately 72%, in this case, indicating that the SCF is located approximately 72% of a conductor length (CL) between A1 and B1. Thus, in this case, the processing unit preferably indicates that the SCF is located approximately 72% of the CL from A1.

To be even more precise, the interconnection information programmed into the processing unit preferably includes details as to electrical characteristics and CLs as well as wire sizes and types used throughout the electrical circuit. For example, suppose the CL from A1 to TB1 is supposed to be approximately 151 inches and the CL from B1 to TB1 is supposed to be approximately 59 inches. Applying the RR to a total conductor length (TCL) between A1 and B1 of approximately 210 inches yields that the SCF must be approximately 151 inches from A1 or substantially adjacent TB1. Therefore, the processing unit preferably indicates that the SCF is located substantially adjacent TB1. In this case, it is anticipated that the technician's first actions will center around examining TB1. Thus, by identifying the location of the fault and nearby items, such as TB1, the fault locator of the present invention guides the technician directly to the location of the fault.

Additionally, the interconnection information may comprise positional information relating to physical paths of the electrical circuit. Using the positional information and the determined location of the fault, the processing unit can determine an actual position of the fault. For example, assuming that the electrical circuit is installed in a vehicle, the processing unit can inform the technician where the fault may be physically found with reference to the vehicle. More specifically, the processing unit may inform the technician that the fault is located behind a specific access panel, within a specific section of conduit, or in a specific junction box, etc.

It should be apparent that finding faults comprises detecting and reporting which termination points are in conflict. Locating faults carries this much further in actually determining and reporting where faults are located along the electrical circuit, drastically cutting time that the technician must spend looking for the fault. Finally, positioning faults further advances the art by determining and reporting where faults may be found with reference to their surroundings.

The processing unit locates open-circuit faults by performing calculations on the capacitance measurement. For example, if there is an open-circuit fault (OCF) between TB2 and TB3, then the testing unit would measure relatively high resistance between either A2 or C2 and either B2 or C1. However, programmed with the interconnection information, the processing unit expects relatively low resistance between any combination of A2, B2, C1, and C2. Additionally, in this case, the resistance measurement between A2 and C2 is also relatively low, as expected. Furthermore, in this case, the resistance measurement between B2 and C1 is relatively low, as expected. Therefore, the processing unit determines that A2 and C2 are both connected to TB2 and B2 and C1 are both connected to TB3, as expected. Thus, the processing unit determines that the OCF is located somewhere between TB2 and TB3.

In order to more accurately locate the OCF, the processing unit next compares the corresponding capacitance measurements with respect to the reference point, such as X1. As an example, suppose the capacitance measurement for A2 is approximately 1247 picoFarads (pF), the capacitance measurement for B2 is approximately 308 pF, the capacitance measurement for C1 is approximately 323 pF, and the capacitance measurement for C2 is approximately 1236 pF. It should be noted that the capacitance measurement for A2 is expected to be substantially identical to the capacitance measurement for C2, since A2 is connected to C2 through the electrical circuit. Likewise, the capacitance measurement for B2 is expected to be substantially identical to the capacitance measurement for C1. In the above example, there are slight variations which may occur for any number of reasons, such as repeatability of the voltage sensor and other internal influences. In any case, more accurate results may be obtained by averaging the values expected to be identical. Thus, in this case, an average for the TB2 side of the OCF is approximately 1242 pF and an average for the TB3 side of the OCF is approximately 316 pF. Then, the processing unit calculates a capacitance ratio (CR) of approximately 80%, indicating that the OCF is located approximately 80% of the TCL between A2 to C2 and B2 to C1.

Additionally, using the interconnection information, the processing unit can calculate the TCL or amount of conductive path on each side of the OCF. For example, suppose the CL from A2 to TB2 is approximately 196 inches, suppose the CL from C2 to TB2 is approximately 84 inches, suppose the CL from B2 to TB3 is approximately 38 inches, suppose the CL from C1 to TB3 is approximately 36 inches, and suppose the CL from TB2 to TB3 is approximately 42 inches. In this case, the TCL is approximately 396 inches. Applying the CR, the OCF is located at approximately 317 inches along the TCL between A2 to C2 and B2 to C1. Since the CL from A2 to C2 is approximately 280 inches, the OCF must be approximately 37 inches from TB2 and approximately 5 inches from TB3. In this case, the processing unit preferably indicates that the OCF is approximately 37 inches from TB2 and approximately 5 inches from TB3, leading the technician to first examine TB3.

In the above examples, the RR and the CR that are calculated by the processing unit may or may not precisely locate the fault. For example, either the RR or the CR may be off by as much as 10%. With simple electrical circuits, a 10% error may be acceptable and still adequately guide the technician to the fault. However, with more complex or very long electrical circuits, the 10% error may not be acceptable requiring the technician to examine several terminal blocks.

The majority of the error experienced by the fault locator may be due to internal influences caused by manufacturing tolerances of internal components and other factors. Thus, the fault locator can be even more accurate by compensating for such internal influences. There are at least two internal influence reduction methods (IIRM) that the fault locator of the present invention may use in compensating for internal influences. A first IIRM involves simply reversing the test points used in calculating the RR and the CR during a first iteration, such as that described above. For example, if the switching unit was directed to connect A1 to T1 and B1 to T2, then the processing unit performs a second iteration directing the switching unit to connect A1 to T2 and B1 to T1. Upon completion of the second iteration, the processing unit preferably averages the RRs and the CRs developed during the first and second iterations. In this manner, the processing unit can minimize at least some of the internal influences of the fault locator.

A second IIRM involves the processing unit subtracting values stored in a tare log, which will be discussed in more detail below, from each measurement taken by the testing unit. As will become apparent, this effectively subtracts the internal influences of the fault locator from the calculations used to develop the RR and the CR. Additionally, the processing unit may develop an extremely accurate RR and CR by using a combination of both the first IIRM and the second IIRM.

The tare log is developed during calibration of the fault locator and effectively stores internal characteristics of the fault locator. These internal characteristics, such as an internal resistance and an internal capacitance, contribute to the internal influences described above. For example, a total ratio of the resistance measurement between A1 and X1 to the resistance measurement between B1 and X1 is approximately 67%. It can be seen that, the total ratio differs from the RR by 5% of the TCL, which is directly related to the influences of the resistance between X1 and the SCF. The internal characteristics of the fault locator may effect the RR and the CR in a similar manner. Thus, the processing unit preferably subtracts the internal resistance and the internal capacitance of the fault locator as described above as was done for the resistance between X1 and the SCF.

The internal resistance is preferably determined by first shorting the switching unit where the electrical circuit or the harness would normally be connected. Then, the processing unit directs the switching unit to cycle through every possible combination of termination points, while the testing unit takes the resistance measurements. The processing unit logs each resistance measurement in the tare log for each combination of termination points, thereby identifying the internal resistance of the fault locator without the harness.

Additionally, the harness may be shorted where the electrical circuit would normally be connected. Then, the processing unit again directs the switching unit to cycle through every possible combination of termination points, while the testing unit takes the resistance measurements. The processing unit again logs each resistance measurement in the tare log for each combination of termination points, thereby identifying the internal resistance of the fault locator with the harness.

Alternatively, the internal resistance of the harness may be calculated. For example, individual internal resistances for each conductor of the harness can be calculated based on length, cross-section, and material for each conductor. Each individual internal resistance may be stored in the tare long and added to the internal resistance for the corresponding combination of termination points.

Similarly, the internal capacitance is preferably determined with the harness connected to the switching unit but disconnected from the electrical circuit. The processing unit then directs the switching unit to cycle through each termination point, while the testing unit takes the capacitance measurements. The processing unit logs each capacitance measurement in the tare log for each termination point, thereby identifying the internal capacitance of the fault locator with the harness. Additionally, or where the harness is not used, the switching unit itself may be left disconnected from both the harness and the electrical circuit. In this case, the processing unit logs each capacitance measurement in the tare log for each combination of termination points, thereby identifying the internal capacitance of the fault locator without the harness. It is important to note that where the harness is used, the tare log preferably contains the internal characteristics of the fault locator both with and without the harness.

The processing unit can not only improve the accuracy of the RR and the CR, as described above, but may even locate faults within the fault locator itself, using the internal characteristics stored in the tare log. For example, if the internal resistance of the fault locator with the harness is greater than the resistance measurement calculated during testing of the electrical circuit, then the SCF must be located somewhere within the fault locator or the harness. The processing unit may also determine more precisely where the SCF is located using the internal resistance associated of the fault locator without the harness. For example, if the resistance measurement calculated during testing of the electrical circuit is between the internal resistance of the fault locator with and without the harness, then the SCF must be located within the harness. Alternatively, if the resistance measurement calculated during testing of the electrical circuit is less than the internal resistance of the fault locator without the harness, then the SCF must be located within the fault locator itself. It is important to note that the processing unit may locate both SCFs and OCFs within the fault locator itself and/or the harness using the procedures discussed above.

It can be seen that the fault locator uses percentages and ratios in locating the faults. This allows the processing unit to disregard environmental concerns, such as temperature effects on the electrical circuit, since the concerns will effect the fault locator, the electrical circuit, and the harness, thereby biasing all measurements in a similar manner. Thus, using ratios effectively negates any errors environmental concerns may otherwise induce.

BRIEF DESCRIPTION OF THE DRAWINGS

A preferred embodiment of the present invention is described in detail below with reference to the attached drawing figures, wherein.

DETAILED DESCRIPTION OF A PREFERRED EMBODIMENT

Figure 1:
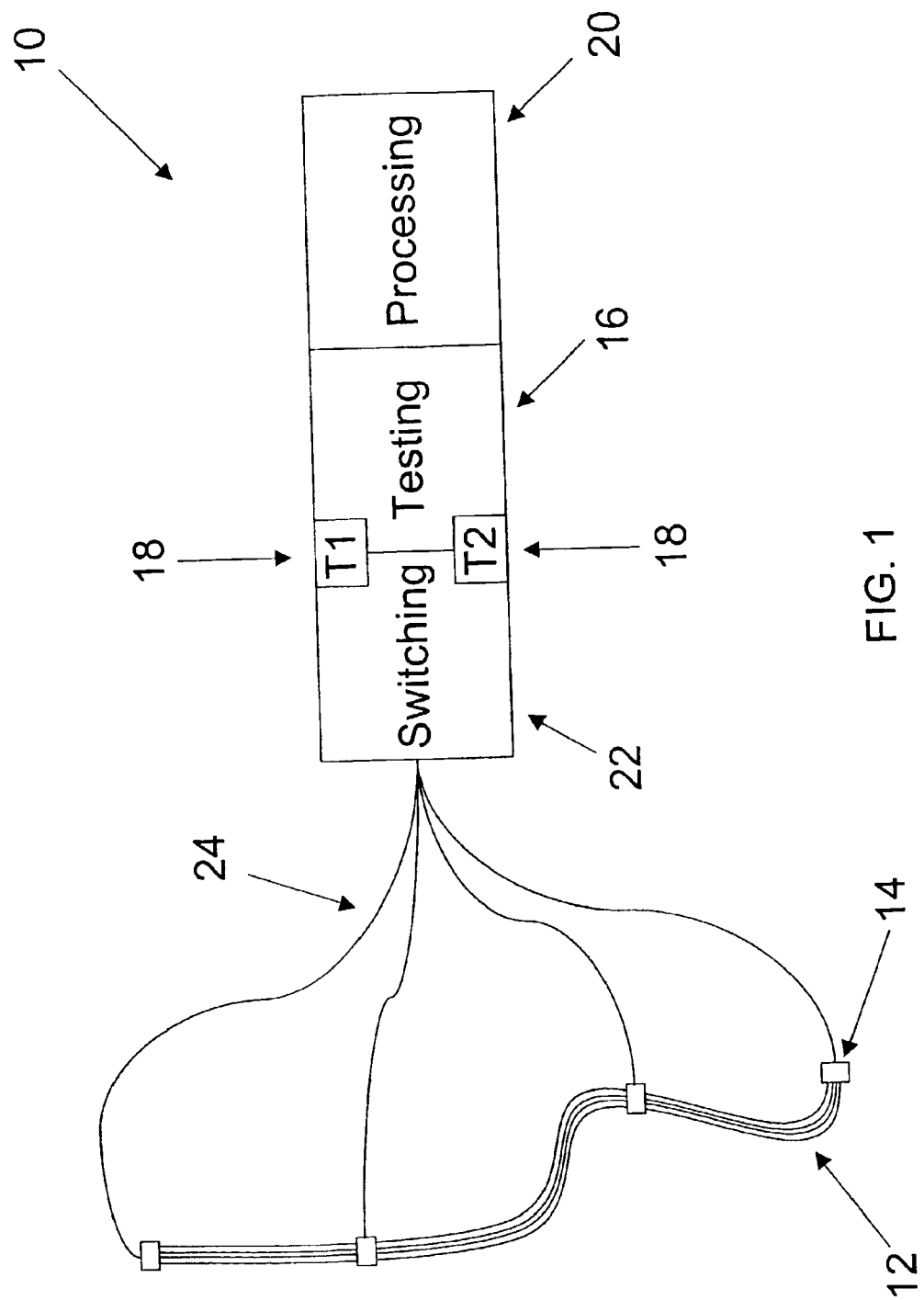
FIG. 1 is a block diagram of a fault locator constructed in accordance with a preferred embodiment of the present invention connected to a electrical circuit.

Referring to FIG. 1, the preferred self-compensating fault locator 10 constructed in accordance with a preferred embodiment of the present invention is illustrated connected to an electrical circuit 12 with a plurality of termination points 14. The fault locator 10 broadly comprises a testing unit 16 to take a resistance measurement between and a capacitance measurement across two test points 18, a processing unit 20 to locate faults by analyzing the measurements taken by the testing unit 16, and a switching unit 22 that can connect the termination points 14 to the test points 18 in a sequence controlled by the processing unit 20. In a preferred embodiment, the fault locator 10 also includes a wiring harness 24, fixture, or other adapter to connect between the electrical circuit 12 at a circuit end and the switching unit 22 at a switching end. Alternatively, the switching unit 22 may be designed to mate directly with the electrical circuit 12.

The electrical circuit 12 may include several hundred termination points 14, with each termination point 14 preferably wired to at least one other termination point 14 according to design requirements and application of the electrical circuit 12. For example and referring also to FIG. 2, the electrical circuit 12 may include termination points, such as A1, A2, B1, B2, C1, C2, and X1 interconnected as shown. It is important to note that while FIG. 2 only shows seven termination points 14, in the interest of simplicity and clarity, it is to be understood that the electrical circuit 12 is expected to be much more complex. Additionally, the electrical circuit 12 may include a plurality of terminal blocks 26, such as TB1, TB2, and TB3. The electrical circuit 12 may also include other common electrical elements, such as, resistors, capacitors, inductors, lamps, switches, diodes, and fuses. Furthermore, the electrical circuit 12 may comprise any combination of circuit board traces and/or bundles of various wiring types, such as coaxial wire, twisted pair, shielded wire, and individual conductors.

The electrical circuit 12 may be of the type used in aircraft, other vehicles, backplanes, appliances, black-boxes, and/or other complicated equipment. For example, the electrical circuit 12 may be designed to provide interconnections for a Boeing model 777 commercial jet airliner. Alternatively, the electrical circuit 12 may be designed to provide interconnections for a light-rail train, an automobile, a printed circuit board, or a super computer. In any case, the electrical circuit 12 may include many wire runs or interconnections each of differing length, wire size, and/or type. Additionally, the termination points 14 may terminate in individual connectors, be grouped into collective connectors, or use a combination of connectors.

As will be discussed in greater detail below, the fault locator 10 must be programmed with interconnection information which is unique to the electrical circuit 12. However, it is anticipated that the fault locator 10 will be used to test many different electrical circuits. For example, a specific aircraft typically includes more than one unique electrical circuit. While the fault locator 10 must be reprogrammed for each unique electrical circuit, the fault locator 10 may be used to test each unique electrical circuit in the specific aircraft or may be used to test unique electrical circuits from several aircraft.

For example, it is commonplace in modern manufacturing to break down a complex task into several smaller tasks and perform each of the smaller tasks at a different place or time in a manufacturing process. Thus, the manufacturing process may incorporate several fault locators 10, with each fault locator 10 programmed to test only one of several unique electrical circuits that go into the specific aircraft. In this manner, each fault locator 10 may be programmed once and then used to test many unique electrical circuits each destined to go into a different specific aircraft. Alternatively, the manufacturing process may utilize only one fault locator 10 and reconfigure that fault locator 10 to test each unique electrical circuit that goes into the specific aircraft.

Figure 3:
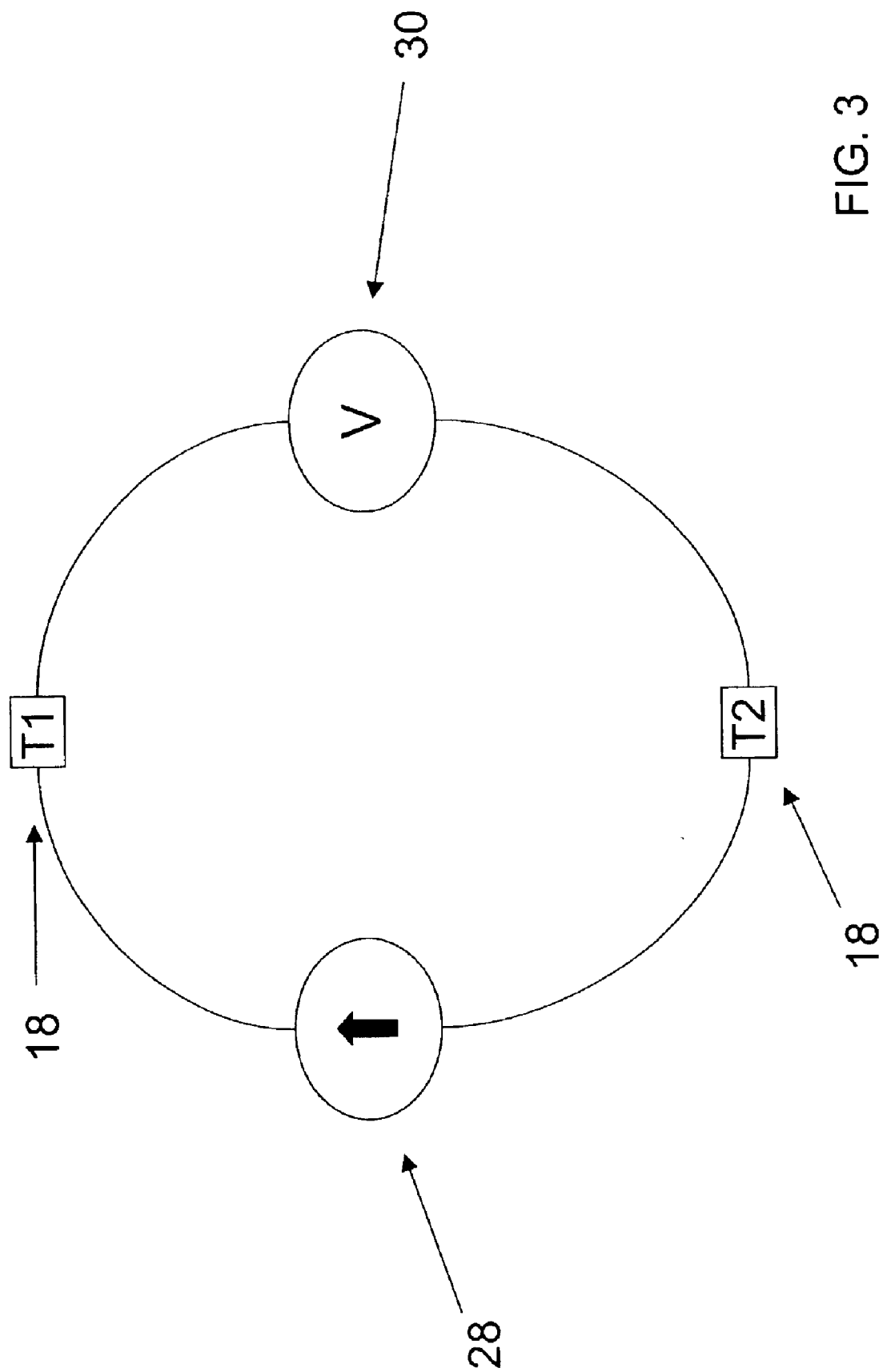
FIG. 3 is a schematic of a testing unit of the fault locator.

Referring also to FIG. 3, the testing unit 16 preferably comprises a first and second test point 18, such as T1 and T2, a precision current source 28 connected across the test points 18, and a precision voltage sensor 30 also connected across the test points 18. The testing unit 16 preferably takes the resistance measurement using the current source 28 to apply current through the test points 18 and the voltage sensor 30 to sense voltage across the test points 18, which is directly proportional to the resistance measurement. Dividing the voltage across the test points 18 by the current through the test points 18 yields the resistance measurement, according to Ohm's Law. Alternatively, the testing unit 16 may use any other commonly used technique to take the resistance measurement.

Similarly, the testing unit 16 preferably takes the capacitance measurement using the current source 28 to apply current through the test points 18 and the voltage sensor 30 to sense voltage across the test points 18. However, in taking the capacitance measurement, the testing unit 16 preferably times how long it takes to reach a specified voltage across the test points 18, which is directly proportional to the capacitance measurement. In other words, the longer it takes to reach the specified voltage, the higher the capacitance measurement. Alternatively, the testing unit 16 may use any other commonly used technique to take the capacitance measurement.

The testing unit 16 preferably communicates the measurements to the processing unit 20 over a measurement bus as digital data words. In an alternative embodiment, the testing unit 16 may provide a resistance analog signal proportional to the resistance measurement and a capacitance analog signal proportional to the capacitance measurement. In this case the testing unit 16 relies on an analog to digital converter in the processing unit 20 to convert the analog signals into the digital data words. In still another alternative embodiment, the testing unit 16 may not include any calculating capability. As such, the testing unit 16 may apply current through the test points 18 according to instructions from the processing unit 20 and provide the processing unit 20 with the voltage across the test points 18, in either digital or analog form. In this manner, the processing unit 20 itself may calculate the measurements. Thus, the testing unit 16 may actually take the measurements or may merely facilitate or assist the processing unit 20 in taking the measurements.

The testing unit 16 and the switching unit 22 may be designed specifically for the electrical circuit 12. For example, the testing unit 16 and the switching unit 22 may be designed to test high voltage electrical circuits. As such, the testing unit 16 and the switching unit 22 may be designed to operate at up to 2000 volts. Alternatively, the testing unit 16 and the switching unit 22 may be designed to test high current electrical circuits. As such, the testing unit 16 and the switching unit 22 may be designed to operate at up to 100 amps.

However, the testing unit 16 and the switching unit 22 may be designed to test both high voltage and high current electrical circuits. Furthermore, the tester 10 may be capable of testing both high voltage and/or high current electrical circuits as well as low voltage and/or low current electrical circuits. In this case, the testing unit 16 and the switching unit 22 may be modular and replaceable in order to test different electrical circuits. Alternatively, the testing unit 16 and the switching unit 22 may be designed to test both high voltage and/or high current electrical circuits as well as low voltage and/or low current electrical circuits without requiring replacement.

The testing unit 16 and the switching unit 22 preferably operate together and under control of the processing unit 20. As discussed above, the testing unit 16 preferably includes two test points 18, and yet is preferably able to take the resistance measurement between each pair of termination points 14 and the capacitance measurement across each termination point 14 and a reference point, which is preferably an unused termination point 14, such as X1. Thus, the switching unit 22 facilitates connecting the test points 18 to each of the termination points 14.

Figure 4:
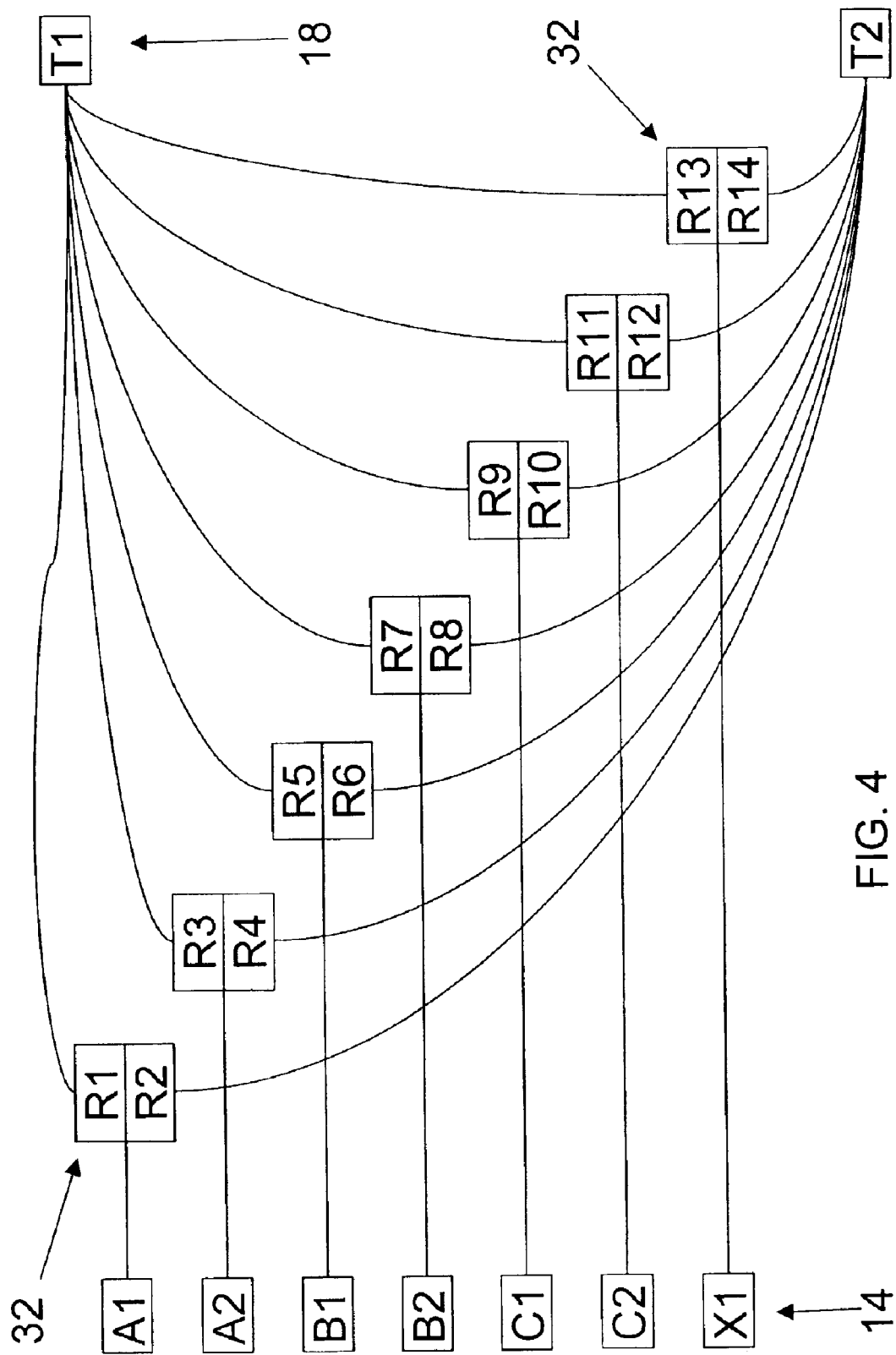
FIG. 4 is a schematic of switching unit of the fault locator.
Figure 5:
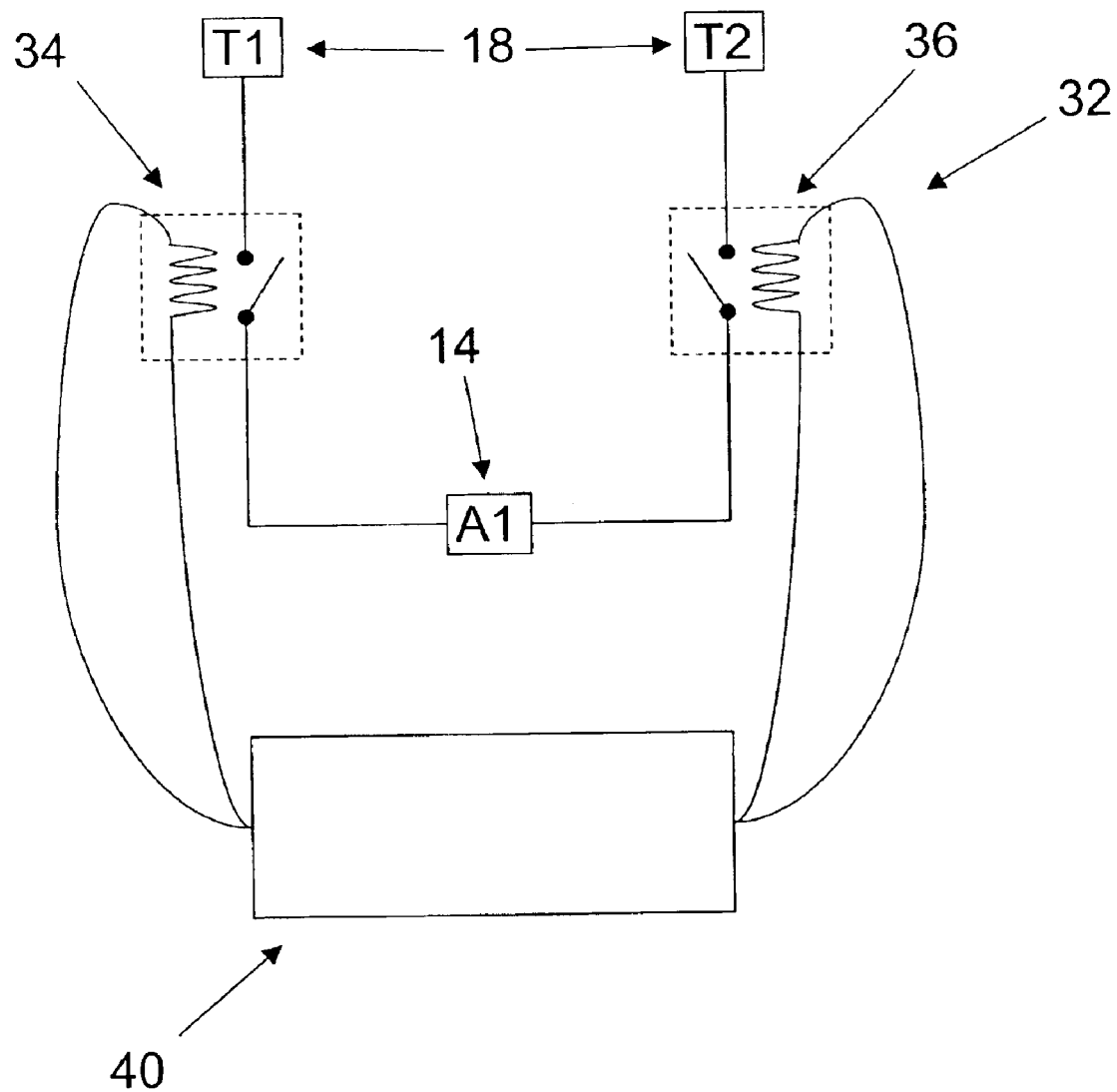
FIG. 5 is a detail schematic of a relay of the switching unit.

Referring also to FIG. 4, the switching unit 22 preferably comprises a pair of single pole single throw relays 32, such as R1, R2, R3, R4, R5, and R6, connected to each termination point 14. Referring also to FIG. 5, a first relay 34 is preferably connected to T1 and a second relay 36 is preferably connected to T2. The relays 32 are preferably controlled by an addressing unit 40 that individually energizes the relays 32 according to digital address words received from the processing unit 20 over an address bus. The address words direct which termination point 14 should be connected to which test point 18, and thus instruct the addressing unit 40 which relays 32 should be energized.

For example, the processing unit 20 may direct the addressing unit 40 of the switching unit 22 to actuate selected relays 32 such that A1 is connected to T1 and B1 is connected to T2. In this case, the addressing unit 40 preferably energizes R1 such that A1 is connected to Ti through the first relay 34. Additionally, the addressing unit 40 preferably energizes R6 such that B1 is connected to T2 through the second relay 36. The addressing unit 40 also preferably de-energizes the remaining relays 32, such that the corresponding termination points 14 are disconnected from the test points 18. With the switching unit 22 configured in this manner, the testing unit 16 can take the resistance measurement between A1 and B1.

Alternatively, the processing unit 20 may direct the switching unit 22 to actuate selected relays 32 such that A1 is connected to T1 and X1 is connected to T2. In this case, the addressing unit 40 preferably energizes R1 such that A1 is connected to T1 through the first relay 34. Additionally, the addressing unit 40 preferably energizes R14 such that X1 is connected to T2 through the second relay 36. The addressing unit 40 also preferably de-energizes the remaining relays 32, such that the corresponding termination points 14 are disconnected from the test points 18. With the switching unit 22 configured in this manner, the testing unit 16 can take the resistance measurement between A1 and X1.

Furthermore, the processing unit 20 may direct the switching unit 22 to actuate selected relays 32 such that X1 is connected to T1 and B1 is connected to T2. In this case, the addressing unit 40 preferably energizes R13 such that X1 is connected to T1 through the first relay 34. Additionally, the addressing unit 40 preferably energizes R6 such that B1 is connected to T2 through the second relay 36. The addressing unit 40 also preferably de-energizes the remaining relays 32, such that the corresponding termination points 14 are disconnected from the test points 18. With the switching unit 22 configured in this manner, the testing unit 16 can take the capacitance measurement across B1 and X1.

As discussed above, the processing unit 20 is preferably programed with the electrical circuit's 12 interconnection information, thereby allowing the processing unit 20 to know which combinations of termination points 14 should result in high and low resistance measurements. Thus, the processing unit 20 preferably compares each resistance measurement to the interconnection information to identify which termination points 14 are in conflict and in what manner the termination points 14 conflict, thereby determining what faults exist in the electrical circuit 12. However, it is insufficient for the processing unit 20 to simply determine which termination points 14 are in conflict, since this doesn't effectively inform a service technician where he or she should begin in order to actually locate and fix the faults. Without more information, the technician must spend many hours trying to locate and fix the faults.

In order to help the technician locate and fix the faults, the processing unit 20 is preferably able to use the measurements to locate where each fault is located in the electrical circuit 12. For example, if TB1 is shorted to X1, as shown by the dashed line in FIG. 2, then the testing unit 16 would measure relatively low resistance between any combination of A1, B1, and X1. While the processing unit 20 may expect the resistance measurement to be relatively low between A1 and B1, the resistance measurement between A1 and X1 is expected to be relatively high. Additionally, the resistance measurement between B1 and X1 is also expected to be relatively high. Since the resistance measurements involving X1 are relatively low, then the processing unit 20 determines that there must be a short-circuit fault (SCF) to X1 somewhere between A1 and B1.

The processing unit 20 next identifies where, between A1 and B1, the SCF is located by comparing the corresponding resistance measurements. As an example, suppose the resistance measurement between A1 and B1 is found to be approximately 0.2461 Ohms, the resistance measurement between A1 and X1 is found to be approximately 0.2166 Ohms, and the resistance measurement between B1 and X1 is found to be approximately 0.1085 Ohms. Since the resistance measurement between B1 and X1 is the smallest value, the SCF must be closer to B1 than to A1.

The processing unit 20 can be even more precise by adding the resistance measurement between A1 and X1 to the resistance measurement between B1 and X1 which yields a sum of approximately 0.3251. The sum, in this case, inherently includes the resistance between X1 and the SCF measured twice and the resistance measurement between A1 and B1. It can be seen that, the sum is approximately 0.0790 Ohms greater than the resistance measurement between A1 and B1. Therefore, the resistance between X1 and the SCF is approximately 0.0395 Ohms.

Figure 2:
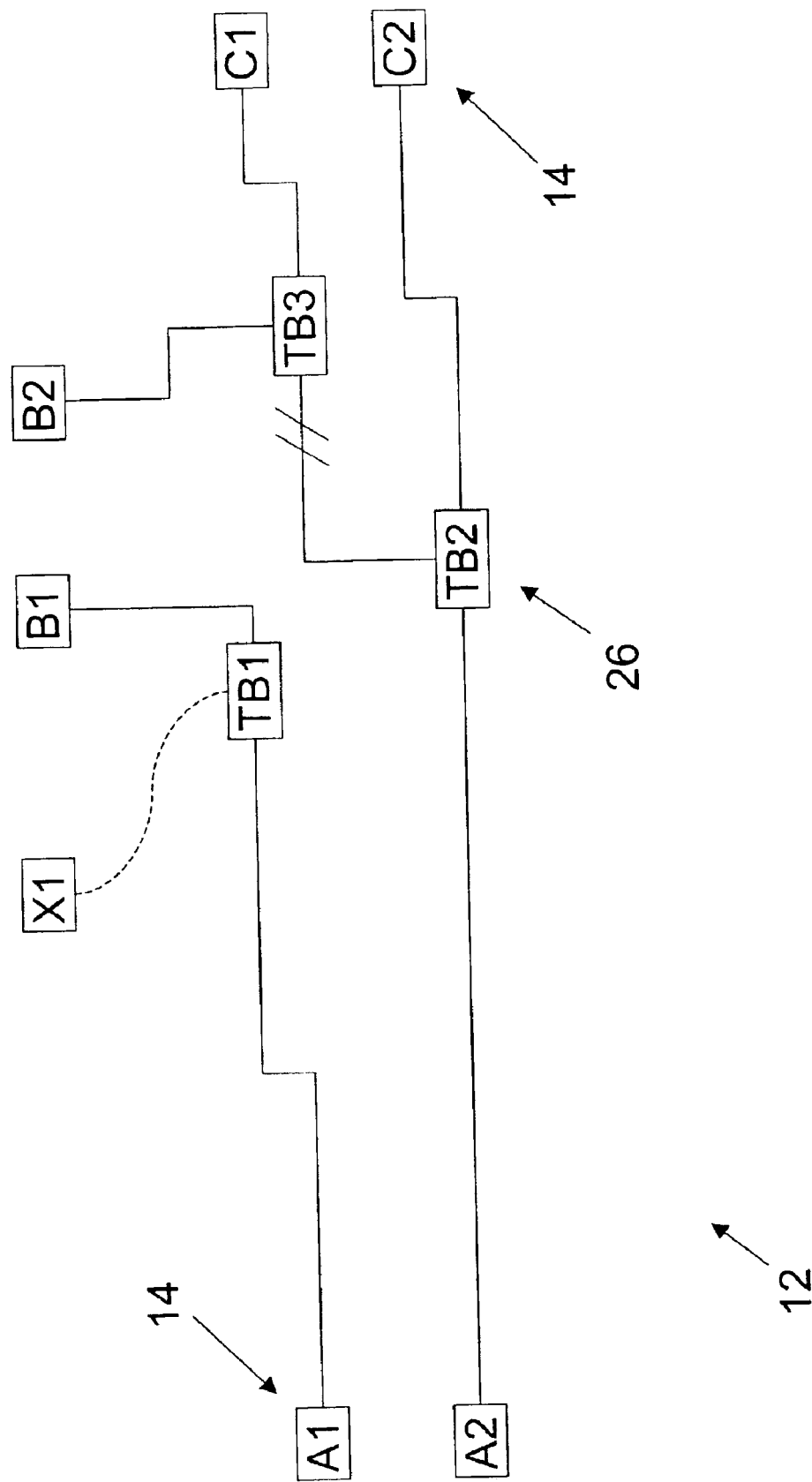
FIG. 2 is a schematic of the electrical circuit showing a simple short-circuit fault and a simple open-circuit fault.

In order to locate the SCF with respect to A1 and B1, the 0.0395 resistance can be subtracted from the resistance measurement between A1 and X1 and the resistance measurement between B1 and X1. In this case, the resistance between A1 and the SCF is approximately 0.1771 Ohms and the resistance between B1 and the SCF is approximately 0.0690 Ohms. The processing unit 20 then calculates a resistance ratio (RR) of approximately 72%, in this case, indicating that the SCF is located approximately 72% of a conductor length (CL) between A1 and B1. As shown in FIG. 2, A1 is interconnected with B1 through TB1 and TB1 is roughly three times as far from A1 as from B1. Thus, in this case, the processing unit 20 preferably indicates that the SCF is located approximately 72% of the CL and near TB1.

To be even more precise, the interconnection information programmed into the processing unit 20 preferably includes details as to electrical characteristics and CLs and wire sizes used throughout the electrical circuit 12. For example, suppose the CL from A1 to TB1 is supposed to be approximately 151 inches and the CL from B1 to TB1 is supposed to be approximately 59 inches. Applying the RR to a total conductor length (TCL) between A1 and B1 of approximately 210 inches yields that the SCF must be approximately 151 inches from A1 or substantially adjacent TB1. Therefore, the processing unit 20 preferably indicates that they SCF is located substantially adjacent TB1. The processing unit 20 may also indicate the CL to the SCF from A1 and/or B1. In this case, it is anticipated that the technician's first actions will center around examining TB1. Thus, by identifying the location of the fault and nearby items, such as TB1, the fault locator 10 of the present invention guides the technician directly to the fault.

Additionally, the interconnection information may comprise positional information relating to physical paths of the electrical circuit 12. Using the positional information and the determined location of the fault, the processing unit 20 can determine an actual position of the fault. For example, assuming that the electrical circuit 12 is installed in a vehicle, the processing unit 20 can inform the technician where the fault may be physically found with reference to the vehicle. More specifically, the processing unit 20 may inform the technician that the fault is located behind a specific access panel, within a specific section of conduit, or in a specific junction box, etc.

It should be apparent that finding faults comprises detecting and reporting which termination points 14 are in conflict. Locating faults carries this much further in actually determining and reporting where faults are located along the electrical circuit 12, drastically cutting time that the technician must spend looking for the fault. Finally, positioning faults further advances the art by determining and reporting where faults may be found with reference to their surroundings.

The processing unit 20 locates open-circuit faults by performing calculations on the capacitance measurement. For example, if there is an open-circuit fault (OCF) between TB2 and TB3, as shown by the diagonal lines in FIG. 2, then the testing unit 16 would measure relatively high resistance between either A2 or C2 and either B2 or C1. However, programmed with the interconnection information, the processing unit 20 expects relatively low resistance between any combination of A2, B2, C1, and C2. Additionally, in this case, the resistance measurement between A2 and C2 is also relatively low, as expected. Furthermore, in this case, the resistance measurement between B2 and C1 is relatively low, as expected. Therefore, the processing unit 20 determines that A2 and C2 are both connected to TB2 and B2 and C1 are both connected to TB3, as expected. Thus, the processing unit 20 determines that the OCF is located somewhere between TB2 and TB3.

In order to more accurately locate the OCF, the processing unit 20 next compares the corresponding capacitance measurements with respect to the reference point, such as X1. As an example, suppose the capacitance measurement for A2 is approximately 1247 picoFarads (pF), the capacitance measurement for B2 is approximately 308 pF, the capacitance measurement for C1 is approximately 323 pF, and the capacitance measurement for C2 is approximately 1236 pF. It should be noted that the capacitance measurement for A2 is expected to be substantially identical to the capacitance measurement for C2, since A2 is connected to C2 through the electrical circuit 12. Likewise, the capacitance measurement for B2 is expected to be substantially identical to the capacitance measurement for C1. In the above example, there are slight variations which may occur for any number of reasons, such as repeatability of the voltage sensor 30 and other internal influences. In any case, more accurate results may be obtained by averaging the values expected to be identical. Thus, in this case, an average for the TB2 side of the OCF is approximately 1242 pF and an average for the TB3 side of the OCF is approximately 316 pF. Then, the processing unit 20 calculates a capacitance ratio (CR) of approximately 80%, indicating that the OCF is located approximately 80% of the TCL between A2 to C2 and B2 to C1.

As discussed above, the interconnection information programmed into the processing unit 20 preferably includes details as to electrical characteristics and CLs as well as wire sizes and types used throughout the electrical circuit 12. Therefore, the processing unit 20 can calculate the TCL or amount of conductive path on each side of the OCF. For example, suppose the CL from A2 to TB2 is approximately 196 inches, suppose the CL from C2 to TB2 is approximately 84 inches, suppose the CL from B2 to TB3 is approximately 38 inches, suppose the CL from C1 to TB3 is approximately 36 inches, and suppose the CL from TB2 to TB3 is approximately 42 inches. In this case, the TCL is approximately 396 inches. Applying the CR, the OCF is located at approximately 317 inches along the TCL between A2 to C2 and B2 to C1. Since the CL from A2 to C2 is approximately 280 inches, the OCF must be approximately 37 inches from TB2 and approximately 5 inches from TB3. In this case, the processing unit 20 preferably indicates that the OCF is approximately 37 inches from TB2 and approximately 5 inches from TB3, leading the technician to first examine TB3.

It is important to note that using only the CL, as described above, assumes that relevant conductors are of sufficiently identical types. Several factors, such as shielding, insulation, wire size, and material, can influence the above described calculations. For example, a larger wire size between A2 and TB2 than between B2 and TB3 may bias the capacitance measurement associated with A2 higher than the capacitance measurement associated with B2. However, the processing unit 20 may compensate for these and other factors using the interconnection information.

In the above examples, the RR and the CR that are calculated by the processing unit 20 may or may not precisely locate the fault. For example, either the RR or the CR may be off by as much as 10%. With simple electrical circuits, such as that shown in FIG. 2, a 10% error may be acceptable and still adequately guide the technician to the fault. However, with more complex or very long electrical circuits, the 10% error may not be acceptable requiring the technician to examine several terminal blocks 26.

The majority of the error experienced by the fault locator 10 may be due to internal influences caused by manufacturing tolerances of internal components and other factors. Thus, the fault locator 10 can be even more accurate by compensating for such internal influences. There are at least two internal influence reduction methods (IIRM) that the fault locator 10 of the present invention may use in compensating for internal influences. A first IIRM involves simply reversing the test points 18 used in calculating the RR and the CR during a first iteration, such as that described above. For example, if the switching unit 22 was directed to connect A1 to T1 and B1 to T2, then the processing unit 22 performs a second iteration directing the switching unit 22 to connect A1 to T2 and B1 to T1. Upon completion of the second iteration, the processing unit 20 preferably averages the RRs and the CRs developed during the first and second iterations. In this manner, the processing unit 20 can minimize at least some of the internal influences of the fault locator 10.

A second IIRM involves the processing unit 20 subtracting values stored in a tare log, which will be discussed in more detail below, from each measurement taken by the testing unit 16. As will become apparent, this effectively subtracts the internal influences of the fault locator 10 from the calculations used to develop the RR and the CR. Additionally, the processing unit 20 may develop an extremely accurate RR and CR by using a combination of both the first IIRM and the second IIRM.

The tare log is developed during calibration of the fault locator 10 and effectively stores internal characteristics of the fault locator 10. These internal characteristics, such as an internal resistance and an internal capacitance, contribute to the internal influences described above. For example, a total ratio of the resistance measurement between A1 and X1 to the resistance measurement between B1 and X1 is approximately 67%. It can be seen that, the total ratio differs from the RR by 5% of the TCL, which is directly related to the influences of the resistance between X1 and the SCF. The internal characteristics of the fault locator 10 may effect the RR and the CR in a similar manner. Thus, the processing unit 20 preferably subtracts the internal resistance and the internal capacitance of the fault locator 10 as described above as was done for the resistance between X1 and the SCF.

The internal resistance is preferably determined by first shorting the switching unit 22 where the electrical circuit 12 or the harness 24 would normally be connected. Then, the processing unit 20 directs the switching unit 22 to cycle through every possible combination of termination points 14, while the testing unit 16 takes the resistance measurements. The processing unit 20 logs each resistance measurement in the tare log for each combination of termination points 14, thereby identifying the internal resistance of the fault locator 10 without the harness 24.

Additionally, the harness 24 may be connected to the switching unit 22 and shorted at the circuit end where the electrical circuit 12 would normally be connected. Then, the processing unit 20 again directs the switching unit 22 to cycle through every possible combination of termination points 14, while the testing unit 16 takes the resistance measurements. The processing unit 20 again logs each resistance measurement in the tare log for each combination of termination points 14, thereby identifying the internal resistance of the fault locator 10 with the harness 24.

Alternatively, the internal resistance of the harness 24 may be calculated. For example, individual internal resistances for each conductor of the harness 24 can be calculated based on length, cross-section, and material for each conductor. Each individual internal resistance may be stored in the tare log and added to the internal resistance for the corresponding combination of termination points 14.

Similarly, the internal capacitance is preferably determined with the harness 24 connected to the switching unit 22 but disconnected from the electrical circuit 12. The processing unit 20 then directs the switching unit 22 to cycle through each termination point 14, while the testing unit 16 takes the capacitance measurements. The processing unit 20 logs each capacitance measurement in the tare log for each termination point 14, thereby identifying the internal capacitance of the fault locator 10 with the harness 24. Additionally, or where the harness 24 is not used, the switching unit 22 itself may be left disconnected from both the harness 24 and the electrical circuit 12. In this case, the processing unit 20 logs each capacitance measurement in the tare log for each combination of termination points 14, thereby identifying the internal capacitance of the fault locator 10 without the harness 24. It is important to note that where the harness 24 is used, the tare log preferably contains the internal characteristics of the fault locator 10 both with and without the harness 24.

The processing unit 20 can not only improve the accuracy of the RR and the CR, as described above, but may even locate faults within the fault locator 10 itself, using the internal characteristics stored in the tare log. For example, if the internal resistance of the fault locator 10 with the harness 24 is greater than the resistance measurement calculated during testing of the electrical circuit 12, then the SCF must be located somewhere within the fault locator 10 or the harness 24. The processing unit 20 may also determine more precisely where the SCF is located using the internal resistance associated of the fault locator 10 without the harness 24. For example, if the resistance measurement calculated during testing of the electrical circuit 12 is between the internal resistance of the fault locator 10 with and without the harness 24, then the SCF must be located within the harness 24 and may be referred to as a harness fault. Alternatively, if the resistance measurement calculated during testing of the electrical circuit 12 is less than the internal resistance of the fault locator 10 without the harness 24, then the SCF must be located within the fault locator 10 itself and may be referred to as a locator fault. It is important to note that the processing unit may locate both SCFs and OCFs within fault locator 10 itself and/or the harness 24. As such, the harness faults and the locator faults may be either SCFs or OCFs.

It can be seen that the fault locator 10 uses percentages and ratios in locating the faults. This allows the processing unit 20 to disregard environmental concerns, such as temperature effects on the electrical circuit 12, since the concerns will effect the entire electrical circuit 12 and thus bias all measurements in a similar manner. Thus, using ratios effectively negates any errors environmental concerns may otherwise induce.

The interconnection information also preferably includes details at to what electrical elements are included in the electrical circuit 12, where those elements are located, and what characteristics those elements posses. Thus, the processing unit 20 can bias the calculations used to develop the RR and the CR by the characteristics of the elements. Similarly, as discussed above, the processing unit 20 can bias the calculations used to develop the RR and the CR by the different wire sizes that may exist in the electrical circuit 12. For example, if the wire between A2 and TB2 is larger that the wire between TB2 and C2, then the resistance between A2 and TB2 may actually be lower than the resistance between TB2 and C2. Thus, the processing unit 20 may bias the RR calculations, such as through dividing the resistance measurement by a cross-sectional area or multiplying the resistance measurement by a gauge size of the wire.

Figure 6:
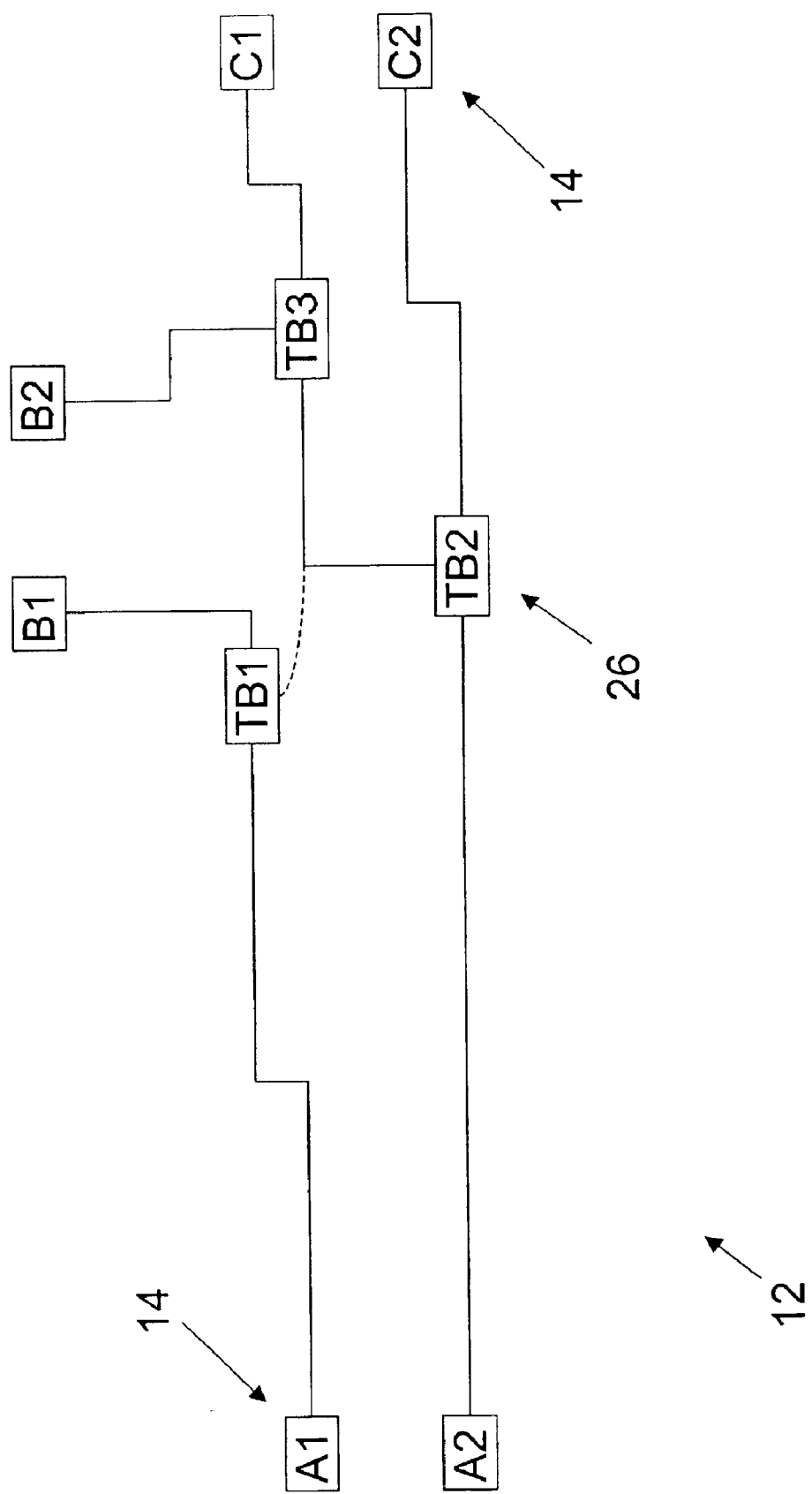
FIG. 6 is a schematic of the electrical circuit showing a more complex short-circuit fault.

As discussed above, while FIG. 2 shows a relatively simple example of the electrical circuit 12, the fault locator 10 is expected to be used with much more complex examples of the electrical circuit 12. Referring also to FIG. 6, in an effort to illustrate a more complex example of the electrical circuit 12, suppose TB1 is shorted to somewhere between TB2 and TB3, as shown by the dashed line. In this case, the testing unit 16 would measure relatively low resistance between any combination of the termination points 14 and manually locating the SCF may be an extremely difficult matter for the technician. However, the fault locator 10 simply utilizes the procedures described above, allowing the processing unit 20 to accurately locate virtually any fault regardless of the complexity of the electrical circuit 12. For example, Table 1 shows exemplary resistance measurements that may be taken by the testing unit 16, in examining the electrical circuit 12 of FIG. 6. Notice that some of the CLs are unknown, since those termination points 14 are not supposed to be connected.

TABLE 1

Resistance Measurements Associated with FIG. 6

| Points | CL (inches) | Resistance (Ohms) |
|---|---|---|
| A1 to A2 | — | 0.4418 |
| A1 to B1 | 210 | 0.2461 |
| A1 to B2 | — | 0.2590 |

TABLE 1-continued

Resistance Measurements Associated with FIG. 6

| Points | CL (inches) | Resistance (Ohms) |
|---|---|---|
| A1 to C1 | — | 0.2566 |
| A1 to C2 | — | 0.3106 |
| A2 to B1 | — | 0.3340 |
| A2 to B2 | 276 | 0.3234 |
| A2 to C1 | 274 | 0.3211 |
| A2 to C2 | 280 | 0.3281 |
| B1 to B2 | — | 0.1512 |
| B1 to C1 | — | 0.1488 |
| B1 to C2 | — | 0.2027 |
| B2 to C1 | 74 | 0.0867 |
| B2 to C2 | 164 | 0.1922 |
| C1 to C2 | 162 | 0.1898 |

However, using the procedures described above, the fault locator 10 can take and utilize measurements for each possible combination of termination points 14. For example, adding the resistance measurement between A1 and B2 to the resistance measurement between B1 and B2 yields a sum of approximately 0.4102. The sum, in this case, inherently includes the resistance between B2 and the SCF measured twice and the resistance measurement between A1 and B1. It can be seen that, the sum is approximately 0.1641 Ohms greater than the resistance measurement between A1 and B1. Therefore, the resistance between B2 and the SCF is approximately 0.0820 Ohms. In this case it is important to note that the 0.0820 Ohm resistance also includes any resistance due to the short itself. Regardless, it follows that the resistance between A1 and the SCF is approximately 0.1770 Ohms and the resistance between B 1 and the SCF is approximately 0.0692 Ohms. In this case, as in the first example, the processing unit 20 calculates the resistance ratio (RR) to be approximately 72%, indicating that the SCF is located approximately 72% of the CL between A1 and B1 or substantially adjacent TB1. This gives us a first conflicting location of the SCF which can be verified comparing A1 and B1 with C1 or C2, in the same manner as was done with B2.

In order to find a second conflicting location of the SCF, we must examine the electrical circuit 12 from an opposing perspective. For example, adding the resistance measurement between A1 and A2 to the resistance measurement between A1 and B2 yields a sum of approximately 0.7008. The sum, in this case, inherently includes the resistance between A1 and the SCF measured twice and the resistance measurement between A2 and B2. It can be seen that, the sum is approximately 0.3774 Ohms greater than the resistance measurement between A2 and B2. Therefore, the resistance between A1 and the SCF is approximately 0.1887 Ohms. In this case it is important to note that the 0.1887 Ohm resistance also includes any resistance due to the short itself. Regardless, it follows that the resistance between A2 and the SCF is approximately 0.2531 Ohms and the resistance between B2 and the SCF is approximately 0.0703 Ohms. In this case, the processing unit 20 calculates the RR to be approximately 78%, indicating that the SCF is located approximately 78% of the CL between A2 and B2.

According to the interconnection information, the TCL between A2 and B2 is supposed to be approximately 276 inches, with 196 inches of that between A2 and TB2, 42 inches of that between TB2 and TB3, and 38 inches of that between TB3 and B2. Applying the RR, the SCF is approximately 215 inches from A2 and approximately 19 inches from TB2. Thus, the SCF must be approximately 23 inches from TB3. In this manner, the processing unit 20 can accurately locate faults even in complex electrical circuits.

It is important to note that if A2 and C2 or B2 and C1 were used instead of A2 and B2, in the above example, the processing unit 20 would have been able to identify that the SCF was generally located between TB2 and TB3. The processing unit 20 would then select other termination points 14 that are connected together on either side of the SCF in order to more accurately locate the SCF. For example, A2 and C1, B2 and C2, or C1 and C2 could have been used instead of A2 and B2 to find the second location of the SCF. Additionally, any of the four combinations, A2 and B2, A2 and C1, B2 and C2, or C1 and C2 can be used to verify the RR calculated using one of the four combinations. Furthermore, all four combinations may be used with the resulting RRs being averaged to calculate a very precise RR. In any case, the processing unit 20 preferably indicates all elements adjacent to the SCF.

The operation of the fault locator 10 has been described above as primarily performing continuity type testing, by testing pairs of the termination points 14. However, the fault locator 10 may also perform isolation type testing. For example, the fault locator 10 may actuate the first relay 34 associated with A1 and the remaining second relays 36, such as those associated with A1, A2, B1, B2, C1, and C2. In this case, X1 would be connected to T1 and the remaining termination points 14 would be connected to T2. In this manner, the fault locator 10 can test isolation between X1 and the remaining termination points 14.

As discussed above, the processing unit 20 indicates faults, fault locations, fault positions, and whether each portion of the electrical circuit 12 pass or fail tests performed by the fault locator 10. It is important to note that these indications are preferably given in two forms. First, the processing unit 20 preferably indicates these results on an electronic display, such as a computer monitor. Second, the processing unit 20 preferably generates a report including text and/or graphics, which may be dumped to a file or printed through a printer.

The processing unit 20 of the fault locator 10 is preferably controlled and monitored through a user interface program. The program preferably allows the technician to view and print the report detailing the measurements taken from the electrical circuit 12. Additionally, the program may allow the technician to provide the interconnection information. Furthermore, the program may allow the technician to specify the manner in which the processing unit 20 tests the electrical circuit 12.

While the fault locator 10 of the present invention may be entirely housed with the body, some components, such as the switching unit 22 may be located outside the body. Additionally, each component of the fault locator 10 may have its own protective body. For example, the processing unit 20 may be housed in a first protective body and the switching unit 22 or a portion of the switching unit 22 may be housed in a second protective body. In this manner, individual components of the fault locator 10 may be located at substantial distances from other components and may communicate over cabling.

As discussed above, the fault locator 10 may be directly connected to the electrical circuit 12 or may be connected to the electrical circuit 12 through the harness 24. Additionally, the fault locator 10 may be connected to the electrical circuit 12 through other adapter forms, such as adapter plates and custom designed connectors.

While the present invention has been described above, it is understood that substitutions can be made. For example, the electrical circuit 12 may actually be one or more simple conductors. While such a simple electrical circuit 12 may not normally warrant such an advanced tester, certain characteristic, such as being extremely long, being buried, or otherwise difficult to access, may require use of the fault locator 10. Furthermore, the switching unit 22 may incorporate single pole single throw electromechanical switches instead of the relays 32. These and other minor modifications are within the scope of the present invention.

Having thus described a preferred embodiment of the invention, what is claimed as new and desired to be protected by Letters Patent includes the following:

1. A fault locator operable to find faults within an electrical circuit having a plurality of termination points, the fault locator comprising:
   a testing unit having two test points and operable to take a resistance measurement and a capacitance measurement between the test points;
   a processing unit operable to locate a short-circuit fault and an open-circuit fault by performing calculations on the measurements taken by the testing unit, store internal characteristics which relate to the fault locator rather than the circuit being tested, and subtract the internal characteristics from the measurements in order to accurately locate the faults; and
   a switching unit operable to automatically reconfigure itself in order to connect the termination points to the test points in a sequence controlled by the processing unit.

2. The fault locator as set forth in claim 1, wherein the processing unit is further operable to substantially determine how far the faults are located from at least one of the termination points.

3. The fault locator as set forth in claim 1, wherein the processing unit is further operable to calculate a ratio relating to a conductor length between the faults and two of the termination points.

4. The fault locator as set forth in claim 1, wherein the internal characteristics include an internal resistance and an internal capacitance.

5. The fault locator as set forth in claim 4, wherein the processing unit is further operable to subtract the internal resistance from the resistance measurement in order to accurately locate the short-circuit fault.

6. The fault locator as set forth in claim 4, wherein the processing unit is further operable to subtract the internal capacitance from the capacitance measurement in order to accurately locate the open-circuit fault.

7. The fault locator as set forth in claim 1, further including a harness operable to mate the switching unit with the electrical circuit.

8. The fault locator as set forth in claim 7, wherein the processing unit is further operable to locate a harness fault using the internal characteristics.

9. The fault locator as set forth in claim 1, wherein the processing unit is further operable to locate a locator fault using the internal characteristics.

10. The fault locator as set forth in claim 1, wherein the processing unit locates the short-circuit fault by performing calculations on the resistance measurement.

11. The fault locator as set forth in claim 1, wherein the processing unit locates the open-circuit fault by performing calculations on the capacitance measurement.

12. A fault locator operable to find faults within an electrical circuit having a plurality of termination points, the fault locator comprising:
   a testing unit having two test points and operable to take a resistance measurement and a capacitance measurement between the test points;

a processing unit operable to compensate for internal characteristics which relate at least to the fault locator while locating a short-circuit fault by performing calculations on the resistance measurement and an open-circuit fault by performing calculations on the capacitance measurement; and a switching unit operable to automatically reconfigure itself in order to connect the termination points to the test points in a sequence controlled by the processing unit.

13. The fault locator as set forth in claim 12, wherein the processing unit is further operable to calculate a ratio relating to a conductor length between the faults and two of the termination points.

14. The fault locator as set forth in claim 12, wherein the processing unit is further operable to store the internal characteristics including an internal resistance and an internal capacitance.

15. The fault locator as set forth in claim 14, wherein the processing unit is further operable to subtract the internal resistance from the resistance measurement in order to accurately locate the short-circuit fault.

16. The fault locator as set forth in claim 14, wherein the processing unit is further operable to subtract the internal capacitance from the capacitance measurement in order to accurately locate the open-circuit fault.

17. The fault locator as set forth in claim 12, wherein the processing unit is further operable to locate a locator fault using the internal characteristics.

18. A self-compensating fault locator operable to find faults within an electrical circuit having a plurality of termination points, the fault locator comprising:

a testing unit having two test points and operable to take both a resistance measurement and a capacitance measurement between the two test points:

a processing unit operable to locate a short-circuit fault by calculating a resistance ratio relating to a conductor length between the short-circuit fault and at least one termination point, the resistance ratio being based on the resistance measurement and an internal resistance which relates to the fault locator;

wherein the processing unit is further operable to locate an open-circuit fault by calculating a capacitance ratio relating to a conductor length between the open-circuit fault and at least one termination point, the capacitance ratio being based on the capacitance measurement and an internal capacitance which relates to the fault locator; and a switching unit operable to automatically reconfigure itself in order to connect the termination points to the test points in a sequence controlled by the processing unit.

19. The fault locator as set forth in claim 18, further including a harness operable to mate the switching unit with the electrical circuit.

20. The fault locator as set forth in claim 19, wherein the processing unit is further operable to locate a harness fault using the internal resistance and the internal capacitance.

21. The fault locator as set forth in claim 20, wherein the processing unit is further operable to locate a locator fault using the internal resistance and the internal capacitance.

22. A fault locator operable to find faults within an electrical circuit having a plurality of termination points, the fault locator comprising:

a testing unit having two test points and operable to take a resistance measurement and a capacitance measurement between the test points;

a processing unit operable to locate a short-circuit fault and an open-circuit fault by performing calculations on the measurements taken by the testing unit, wherein the processing unit is further operable to store internal characteristics;

a switching unit operable to automatically reconfigure itself in order to connect the termination points to the test points in a sequence controlled by the processing unit;

a harness operable to mate the switching unit with the electrical circuit; and wherein the processing unit is further operable to locate a harness fault using the internal characteristics.

23. A self-compensating fault locator operable to find faults within an electrical circuit having a plurality of termination points, the fault locator comprising:

a testing unit having two test points and operable to take a resistance measurement and a capacitance measurement between the test points;

a processing unit operable to locate a short-circuit fault by calculating a resistance ratio relating to a conductor length between the short-circuit fault and at least one termination point, the resistance ratio being based on the resistance measurement and an internal resistance;

wherein the processing unit is further operable to locate an open-circuit fault by calculating a capacitance ratio relating to a conductor length between the open-circuit fault and at least one termination point, the capacitance ratio being based on the capacitance measurement and an internal capacitance;

a switching unit operable to automatically reconfigure itself in order to connect the termination points to the test points in a sequence controlled by the processing unit a harness operable to mate the switching unit with the electrical circuit; and wherein the processing unit is further operable to locate a harness fault using the internal resistance and the internal capacitance.

24. A fault locator operable to find faults within an electrical circuit having a plurality of circuit termination points, the fault locator comprising:

a testing unit having two test points and operable to take a resistance measurement and a capacitance measurement between the test points;

a processing unit operable to locate a short-circuit fault and an open-circuit fault by performing calculations on the measurements taken by the testing unit, wherein the processing unit is further operable to store internal characteristics which relate to the fault locator rather than the circuit being tested and subtract the internal characteristics from the measurements in order to accurately locate the faults; and a switching unit having a plurality of locator termination points at least equal in number to the circuit termination points, the switching unit being operable to automatically reconfigure itself in order to connect the locator termination points to the test points in a sequence controlled by the processing unit.

25. The fault locator as set forth in claim 24, wherein the testing unit has only two test points and is operable to take both the resistance measurement and the capacitance measurement between the two test points.

* * * * *